United States Patent
Huang

(10) Patent No.: US 6,291,263 B1
(45) Date of Patent: Sep. 18, 2001

(54) METHOD OF FABRICATING AN INTEGRATED CIRCUIT PACKAGE HAVING A CORE-HOLLOWED ENCAPSULATION BODY

(75) Inventor: Chien Ping Huang, Hsinchu Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 09/592,689

(22) Filed: Jun. 13, 2000

(51) Int. Cl.[7] ............................ H01L 21/44; H01L 21/48; H01L 21/50
(52) U.S. Cl. ............................................. 438/106; 438/51
(58) Field of Search ............................... 438/51, 55, 108, 438/112, 123, 124, 126, 127, 122, 106, 113

(56) References Cited

U.S. PATENT DOCUMENTS 5,070,041 * 12/1991 Katayama et al. .................... 438/124
5,482,898 * 1/1996 Marrs .................................... 438/123
5,563,443 * 10/1996 Beng et al. ........................... 257/666
5,650,593 * 7/1997 Mc Millan et al. .................. 174/52.4

\* cited by examiner

Primary Examiner—David Nelms
Assistant Examiner—David Nhu
(74) Attorney, Agent, or Firm—Peter F. Corless; Edwards & Angell, LLP

(57) ABSTRACT

An integrated circuit packaging method is provided for fabriacting an integrated circuit package of the type having a core-hollowed encapsulation body. The provided method includes the steps: preparing a leadframe including a die-bonding area and a wire-bonding area; attaching a tape onto the front side of the leadframe to cover the entire die-bonding area and the wire-bonding area; performing a molding process to thereby form an encapsulation body having a core-hollowed portion; removing the tape to expose the die-bonding area; connecting a set of bonding wires for electrically coupling the semiconductor die to the wire-bonding area of the leadframe; and covering a lid on the opening of the core-hollowed portion of the encapsulation body. Since the entire die-bonding area and the wire-bonding area are covered by the tape during the molding of the encapsulation body, the entire die-bonding area and the wire-bonding area can be prevented from resin flash.

9 Claims, 2 Drawing Sheets

METHOD OF FABRICATING AN INTEGRATED CIRCUIT PACKAGE HAVING A CORE-HOLLOWED ENCAPSULATION BODY

BACKGROUND OF THE INVENTION

1. Field of the Invention

This invention relates to integrated circuit packaging technology, and more particularly, to a method of fabricating an integrated circuit package of the type having a core-hollowed encapsulation body for housing an optically-sensitive semiconductor chip.

2. Description of Related Art

Semiconductor device packaging technology is used to pack one or more semiconductor chips in a single module that can be easily handled and mounted onto printed circuit boards. Typically, the semiconductor chip or chips are enclosed inside an opaque compound (or called encapsulation body), and is thus invisible from the outside. However, for optically-sensitive types of semiconductor chips, such as image-sensor chips or ultraviolet-sensitive EP-ROM (Electrically-Programmable Read-Only Memory) chips, it is required to allow these chips to sense ambient light. For this reason, a special package configuration is used to pack these types of semiconductor chips. One conventional package configuration to pack an optically-sensitive semiconductor chip is to mount it inside an encapsulation body having a core-hollowed portion; and then, after performing wire bonding to the chip, hermetically seal an transparent lid over the opening of the core-hollowed portion of the encapsulation body. Ambient light can then pass through the transparent lid to the inside of the encapsulation body to be sensed by the chip enclosed therein.

One drawback to the forgoing package configuration, however, is that, during the molding of the core-hollowed encapsulation body, resin flash on lead frame is a serious problem, which would undesirably degrade the quality of the die attachment and wire bonding on the flashed parts of the lead frame. To solve this problem, various solutions have been proposed, including, for example, the U.S. Pat. No. 5,070,041 entitled "METHOD OF REMOVING FLASH FROM A SEMICONDUCTOR LEADFRAME USING COATED LEADFRAME AND SOLVENT" issued on Dec. 3, 1991, which can remove resin flash built up on lead frame without damaging resin molded section. This patented method is characterized in the steps of coating an organic high-molecule substance over the areas of the lead frame that are to be uncovered by the encapsulation body; and then, after the encapsulation body is completely formed, using a special solvent to wash away the organic high-molecule coating, whereby the resin flash can be removed together with the organic high-molecule coating. After this, a semiconductor chip is mounted onto the flash-free die pad, and then a transparent lid is hermetically sealed to the opening of the core-hollowed portion of the encapsulation body.

The forgoing patented method, however, has the following drawbacks. Firstly, the step of coating organic high-molecule substance and the subsequent step of dissolving the coating to remove resin flash are quite complex in procedure and costly to implement, making the overall fabrication process quite cost-ineffective. Secondly, the solvent can be corrosive to the lead frame, which would also undesirable degrade the quality of the die attachment and wire bonding on the lead frame. Third, the solvent, after being used, would cause pollution and thus is environmentally-unfriendly to use.

SUMMARY OF THE INVENTION

It is therefore an objective of this invention to provide a new method for fabricating a semiconductor device package of the type having a core-hollowed encapsulation body, which can help prevent resin flash on lead frame during the molding of the core-hollowed encapsulation body.

It is another objective of this invention to provide a s method for fabricating a semiconductor device package of the type having a core-hollowed encapsulation body, which can help prevent resin flash on lead frame without having to use expensive coating process and environmentally-pollutant solvent.

It is still another objective of this invention to provide a new method for fabricating a semiconductor device package of the type having a core-hollowed encapsulation body, which can help prevent resin flash on lead frame in a more cost-effective and quality-assured way than the prior art.

It is still another objective of this invention to provide a new method for fabricating a semiconductor device package of the type having a core-hollowed encapsulation body, which allows the fabricated package to be more reliable to use than the prior art.

In accordance with the foregoing and other objectives, the invention proposes a new method for fabricating a semiconductor device package of the type having a core-hollowed encapsulation body.

The method of the invention comprises the following procedural steps: preparing a leadframe including a die-bonding area and a wire-bonding area and having a front side and a back side; attaching a tape of a specific size onto the front side of the leadframe to cover the entire die-bonding area and the wire-bonding area; performing a molding process by fixing the leadframe in an encapsulation mold and filling an encapsulation material into all the void portions in the encapsulation mold to thereby form an encapsulation body having a core-hollowed portion; removing the tape to expose the die-bonding area and the wire-bonding area; attaching a semiconductor chip onto the die-bonding area; connecting a set of bonding wires for electrically coupling the semiconductor die to the wire-bonding area of the leadframe; and covering a lid on the opening of the core-hollowed portion of the encapsulation body.

It is a characteristic feature of the invention that, since the entire die-bonding area and the wire-bonding area are covered by the tape during the molding of the encapsulation body, the entire die-bonding area and the wire-bonding area would be prevented from resin flash. Therefore, after the tape is removed, these areas would be substantially free of resin flash. Since the removal of the tape is very easy to carry out and would cause no pollution as compared to the use of solvent for post treatment by the prior art, the invention is more advantageous to use than the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, two preferred embodiments are disclosed in full details in the following with reference to the accompanying drawings.

First Preferred Embodiment

Figure 1A:
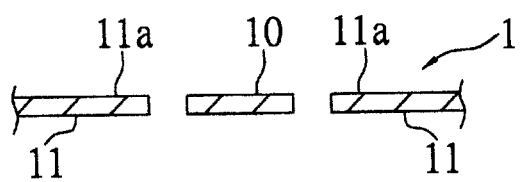
FIGS. 1A–1F are schematic sectional diagrams used to depict the procedural steps involved in a first preferred embodiment of the method of the invention for fabricating an integrated circuit package of the type having a core-hollowed encapsulation body.
Figure 1B:
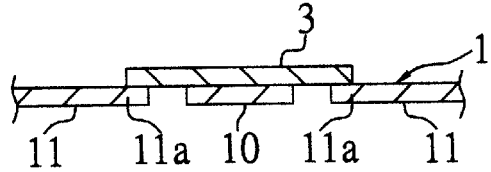
Figure 1C:
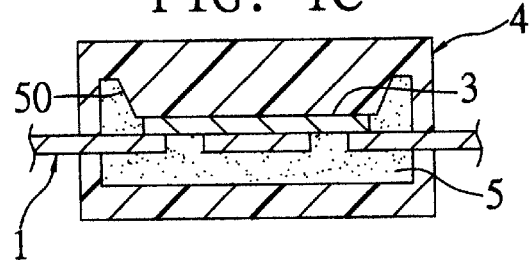
Figure 1D:
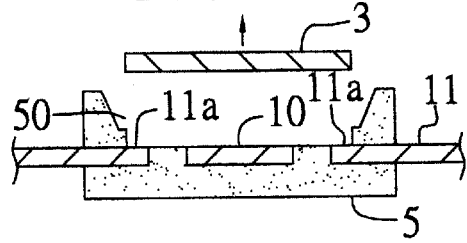
Figure 1E:
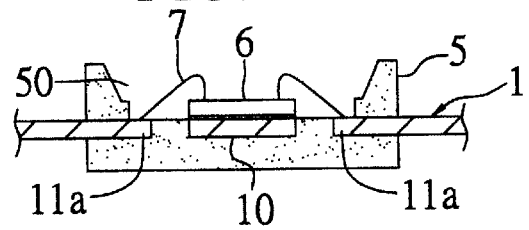
Figure 1F:
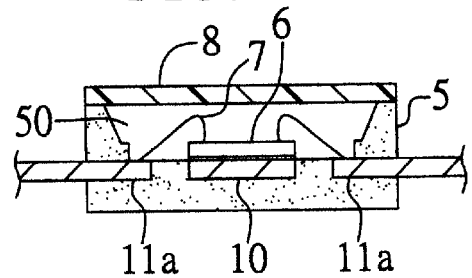
Figure 2:
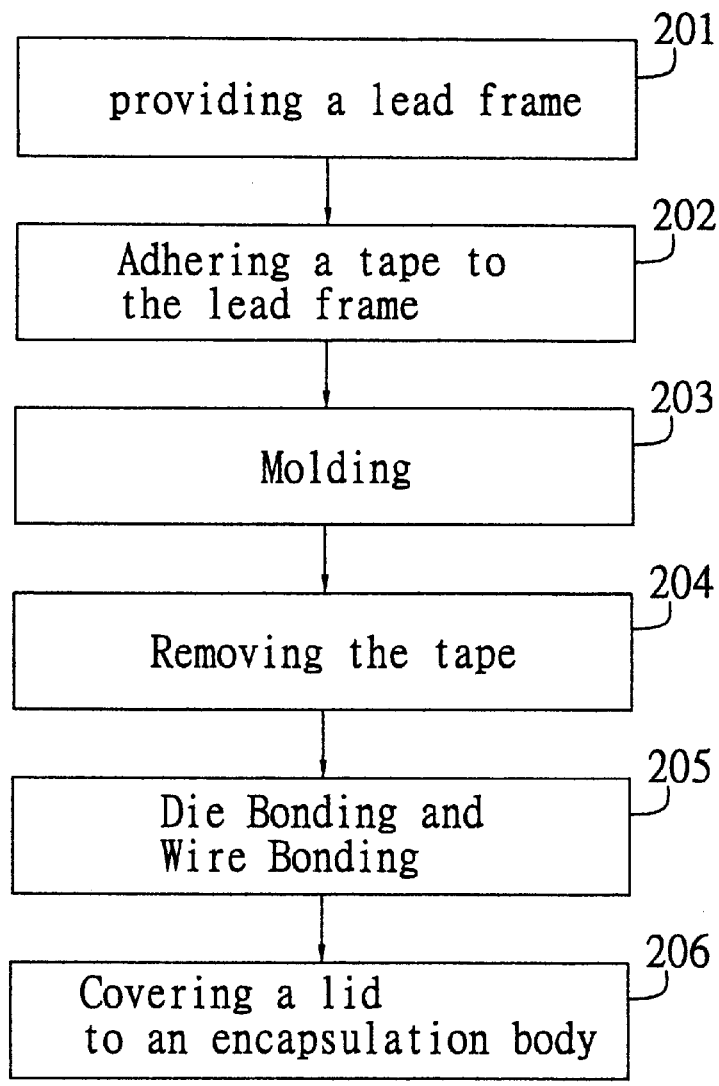
FIG. 2 is a flow diagram showing the procedural steps involved in the method of the invention.

FIGS. 1A–1F are schematic sectional diagrams used to depict the procedural steps involved in the first preferred embodiment of the method of the invention for fabricating an integrated circuit package of the type having a core-hollowed encapsulation body; while FIG. 2 is a flow diagram showing the procedural steps involved in the method of the invention.

Referring to FIG. 1A and FIG. 2, by the method of the invention, the first step 201 is to prepare a leadframe 1 having a die pad 10 and a lead portion 11 (the lead portion 11 includes a plurality of leads, which are not all shown in the sectional view of FIG. 1A). The die pad 10 is used for die attachment, while the inner end 11a of the lead portion 11 is used for wire bonding. It is to be noted that the leadframe 1 can also be the type having no die pad, i.e., eliminating the die pad 10, and die attachment is carried out on the inner part of the lead portion 11 so that the chip contact surface against the leadframe 1 can be reduced to minimum to prevent delamination (to be detailed later in the second preferred embodiment).

Referring to FIG. 1B and FIG. 2, in the next step 202, a tape 3 made of polyimide or the like is attached onto the leadframe 1, which has a specific size that allows it to cover the entire die pad 10 and the inner end 11a of the lead portion 11. This tape 3 will be later used to prevent resin flash on the covered areas during subsequent molding process. The tape 3 should be heat-resistant so that it would not be deformed under the high-temperature condition during the subsequent molding process that would otherwise expose the covered areas.

Referring to FIG. 1C and FIG. 2, in the next step 203, a molding process is performed by fixing the leadframe 1 in an encapsulation mold 4 and then filling resin into all the void portions in the encapsulation mold 4. Through this process, an encapsulation body 5 is formed. This encapsulation body 5 has a core-hollowed portion 50 over the front side of the tape 3.

Referring to FIG. 1D and FIG. 2, in the next step 204, the tape 3 is removed from the leadframe 1 to expose the covered areas, i.e., the entire die pad 10 and the inner end 11a of the lead portion 11. It is a characteristic feature of the invention that, since the entire die pad 10 and the inner end 11a of the lead portion 11 are covered by the tape 3 during the molding of the encapsulation body 5, the entire die pad 10 and the inner end 11a of the lead portion 11 would be prevented from resin flash. Therefore, after the tape 3 is removed, these leadframe parts would be substantially clean without having resin flash. Moreover, since the removal of the tape 3 is very easy to carry out and would cause no pollution as compared to the use of solvent for post treatment by the prior art, it is undoubted that the invention is more advantageous to use than the prior art.

Referring to FIG. 1E and FIG. 2, in the next step 205, a die-bonding process is performed to attach a semiconductor chip 6 onto the die pad 10 by means of an adhesive agent such as silver paste. After this, a wire-bonding process is performed to bond a set of gold wires 7 for electrically coupling the chip 6 to the inner end 11a of the lead portion 11.

Referring to FIG. 1F and FIG. 2, in the next step 206, a lidding process is performed to hermetically cover a lid 8 on the top opening of the core-hollowed portion 50 of the encapsulation body 5 by means of an adhesive agent such as epoxy resin. The lid 8 can be either made of a transparent material, such as crystal glass, sapphire plate, or plastics; or made of a non-transparent material such as colored glass, ceramics, or colored plastics. This completes the fabrication of the integrated circuit package.

Second Preferred Embodiment

Figure 3:
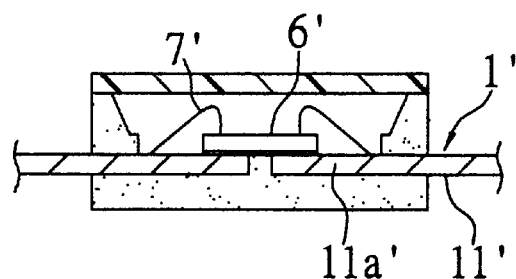
FIG. 3 is a schematic sectional diagram showing a second preferred embodiment of the method of the invention.

FIG. 3 is a schematic sectional diagram showing the second preferred embodiment of the method of the invention. In FIG. 3, the parts that are identical in structure and purpose as those in the previous embodiment are labeled with the same reference numerals appended with a prime mark.

This embodiment differs from the previous one only in that the integrated circuit package shown here is constructed on a leadframe 1' having no die pad but including a plurality of leads 11' (not all are shown in the sectional view of FIG. 3). On this leadframe 1', the die-bonding area is the area defined by the inner ends 11a' of the leads 11', on which a semiconductor chip 6' is mounted. This allows the contact surface between the chip 6' and the leadframe 1' to be reduced as compared to the previous embodiment, thereby reducing the possibility of delamination.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a core-hollowed integrated circuit package, comprising the steps of:

preparing a leadframe including a die-bonding area and a wire-bonding area and having a front side and a back side;

attaching a tape of a specific size onto the front side of the leadframe to cover the entire die-bonding area and the wire-bonding area;

performing a molding process by fixing the leadframe in an encapsulation mold and filling an encapsulation material into all the void portions in the encapsulation mold to thereby form an encapsulation body having a core-hollowed portion;

removing the tape to expose the die-bonding area and the wire-bonding area;

attaching a semiconductor chip onto the die-bonding area;

connecting a set of bonding wires for electrically coupling the semiconductor die to the wire-bonding area of the leadframe; and covering a lid on the opening of the core-hollowed portion of the encapsulation body.

2. The method of claim 1, wherein the tape is made of a heat-resistant material.

3. The method of claim 2, wherein the heat-resistant material is polyimide.

4. The method of claim 1, wherein the encapsulation body encapsulates the entire back side of the leadframe and the part of the front side beyond the die-bonding area.

5. The method of claim 1, wherein the die-bonding area is a die pad, while the wire-bonding area is the inner part of a plurality of leads.

6. The method of claim 1, wherein the die-bonding area and the wire-bonding area are defined from the inner parts of a plurality of leads.

7. The method of claim 1, wherein the bonding wires are gold wires.

8. The method of claim 1, wherein the lid is a transparent lid.

9. The method of claim 1, wherein the lid is a nontransparent lid.

* * * * *